(12) United States Patent
Takehara et al.

(10) Patent No.: US 6,259,017 B1
(45) Date of Patent: Jul. 10, 2001

(54) SOLAR POWER GENERATION APPARATUS AND CONTROL METHOD THEREFOR

(75) Inventors: Nobuyoshi Takehara; Naoki Manabe, both of Kyoto-fu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/417,907

(22) Filed: Oct. 14, 1999

(30) Foreign Application Priority Data

Oct. 15, 1998 (JP) .................................................. 10-307818
Sep. 29, 1999 (JP) .................................................. 11-276676

(51) Int. Cl.[7] ............................ G05F 1/67; H01L 31/042
(52) U.S. Cl. .......................... 136/293; 136/244; 136/291; 363/49; 363/50; 363/55; 363/71; 323/906
(58) Field of Search ..................................... 136/244, 291, 136/293; 363/49, 50, 55, 71; 323/906; 60/641.8

(56) References Cited

U.S. PATENT DOCUMENTS

| | | | |
|---|---|---|---|
| 4,636,931 | * | 1/1987 | Takahashi et al. ...................... 363/71 |
| 5,677,833 | * | 10/1997 | Bingley ................................... 363/71 |
| 6,031,736 | * | 2/2000 | Takehara et al. ....................... 363/21 |

FOREIGN PATENT DOCUMENTS

| | | |
|---|---|---|
| 878850 | * 11/1998 | (EP) . |
| 7-67346 | 3/1995 | (JP) . |
| 8-179841 | * 7/1996 | (JP) . |
| 10-61898 | 3/1998 | (JP) . |
| 10-271688 | 10/1998 | (JP) . |
| 11-252803 | * 9/1999 | (JP) . |

OTHER PUBLICATIONS

Takahashi and Hosokawa, "Development of 1 MW Centralized PV Power Plant," 17th IEEE Photovoltaic Specialists Conference, Kissimmee, FL, pp. 1031–1035, May 1–4, 1984, published Oct. 30, 1984.*

K. Furukawa, et al. "Transformer–less Inverter for Photovoltaic Power System", Inst. of Elec. Eng. of Japan, Ind. Appl. Soc., transaction No. 77, pp. 217–220 (1996). (month unknown).

* cited by examiner

*Primary Examiner*—Alan Diamond
(74) *Attorney, Agent, or Firm*—Fitzpatrick, Cella, Harper & Scinto

(57) ABSTRACT

A solar power generation apparatus includes solar battery arrays, each of which has solar battery modules, non-isolated inverters, each of which converts direct-current power generated by one of the solar battery arrays to alternating-current power and provides the alternating-current power to a commercial power system, an earth leakage circuit breaker arranged between the non-isolated inverters and the commercial power system and connected to outputs of the non-isolated inverters in parallel, and a controller for controlling operation of the non-isolated inverters. The controller controls start-timing of the operation of at least one inverter to be different from that of another inverter. This arrangement can prevent any undesirable operation of the earth leakage circuit breaker.

20 Claims, 9 Drawing Sheets

SOLAR POWER GENERATION APPARATUS AND CONTROL METHOD THEREFOR

BACKGROUND OF THE INVENTION

1. Field of the Invention

The present invention relates to a solar power generation apparatus and a control method therefor and, more particularly, to a solar power generation apparatus capable of minimizing instances of undesired operation of an earth leakage circuit breaker, and a control method therefor.

2. Description of the Related Art

As the popularity of home solar power generation systems grows, many studies aiming at cost reduction are being made. To that same end, currently roof-integrated solar battery modules which require no frames, and non-isolated inverters (so-called transformerless inverters) are being put into practical use.

FIG. 6 shows the arrangement of a general system interconnection solar power generation system. The system interconnection solar power generation system sends power generated by a solar battery array 1 to a commercial power system 3 via an inverter 2. An earth leakage circuit breaker 4 is inserted between the inverter 2 and the commercial power system 3. When an earth leakage failure occurs at a customer's or subscriber's home, the earth leakage circuit breaker 4 completely disconnects the solar power generation system from the commercial power system 3 to prevent spread of disasters (e.g., fire).

Since solar batteries are installed outdoor across a relatively large area (e.g., about 30 $m^2$ for a power generation capacity of 3 kW), the solar battery array 1 has a relatively large earth capacitance 5, and this may generate a leakage current which may inadvertently operate the earth leakage circuit breaker 4, as is pointed out in K. Furkawa, et al., "Transformer-less Inverter for Photovoltaic Power System", The Institute of Electrical Engineers of Japan, Industry Applications Society, National Convention, Transaction No. 77, pp. 217–220 (1996). Actually, when an earth leakage circuit breaker and, more particularly, an input earth leakage circuit breaker operates, service interruption is experienced by the customer. Even when an earth leakage circuit breaker is dedicated to an inverter for solar power generation, solar power generation is stopped by breaking operation of the earth leakage circuit breaker, resulting in a loss in the generated energy.

Takehara as one of the present inventors has disclosed, in U.S. Ser. No. 09/071,299, the relationship between the earth capacitance and the sensitivity of the earth leakage circuit breaker, with which hardly any undesired operation of the earth leakage circuit breaker occurs. Having also found as result of extensive studies that an impulse-like leakage current as shown in FIG. 2 is generated due to a variation in the earth potential of the solar battery array at the start time of interconnection of a transformerless inverter, he proposed in Japanese Patent Application No. 10-61898 that instances of undesirable operation of the earth leakage circuit breaker are eliminated by providing a potential fixing means in the transformerless inverter. With this proposal, when a transformerless inverter and an earth leakage circuit breaker form one set, operation errors of the earth leakage circuit breaker can be eliminated.

However, in a relatively large solar power generation system, a plurality of transformerless inverters may be connected to a single earth leakage circuit breaker. In this case, measures against undesirable operation of the earth leakage circuit breaker have not yet been fully explored.

SUMMARY OF THE INVENTION

The present invention has been made to solve the above problem and has as its object to operate a solar power generation apparatus using a plurality of transformerless inverters without trouble.

In order to achieve the above object, according to the resent invention, there is provided a solar power generation apparatus comprising solar battery arrays, each of which has solar battery modules; non-isolated inverters, each of which converts direct-current power generated by one of said solar battery arrays to alternating-current power and provides the alternating-current power to a commercial power system; an earth leakage circuit breaker arranged between said non-isolated inverters and the commercial power system and connected to outputs of said non-isolated inverters in parallel; and a controller which controls operation of said non-isolated inverters, wherein said controller controls start-timing of the operation of at least one inverter to be different from that of another inverter.

There is also provided a control method for a solar power generation apparatus having solar battery arrays each of which has solar battery modules, non-isolated inverters, each of which converts direct-current power generated by one of the solar battery arrays to alternating-current power and provides the alternating-current power to a commercial power system, and an earth leakage circuit breaker arranged between said non-isolated inverters and the commercial power system and connected to outputs of the non-isolated inverters in parallel, said method comprising the step of controlling start-timing of operation of at least one inverter to be different from that of another inverter.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Figure 1:
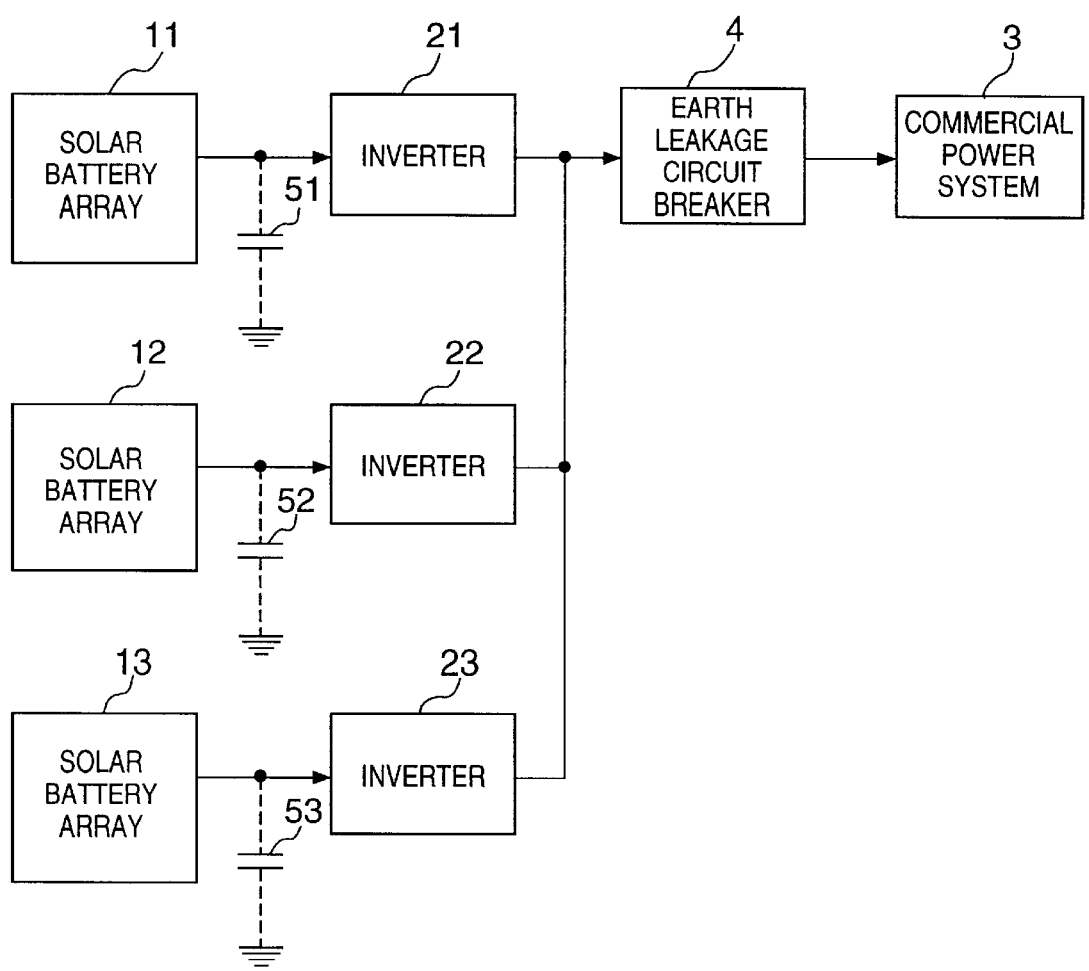
FIG. 1 is a block diagram showing a solar power generation system according to the first embodiment of the present invention.

According to studies of the present inventors, there are two problems encountered in the use of a plurality of transformerless inverters (to be simply referred to as "inverters" hereinafter).

As the first problem, when the number of inverters simply increases, capacitors constructing the output filters of the inverters form a parallel circuit when viewed from a commercial power system 3, resulting in an increase in static leakage current. Since this decreases the operation margin of an earth leakage circuit breaker 4, the breaker operates at higher sensitivity as compared to when only a single inverter is used.

The second problem is the problem of a transient leakage current generated when the inverters start operating. When the plurality of inverters are simultaneously started, transient leakage currents generated by the individual inverters add up to generate a large current. This operates the earth leakage circuit breaker 4 more than necessary.

With an emphasis on the latter problem, the present inventors attempted to prevent undesirable operation of the earth leakage circuit breaker by shifting the start-timings of inverters to decrease or eliminate superposition of transient leakage currents.

The present invention can provide an effect by shifting the start-timing of at least one of the plurality of inverters from that of another inverter. When all the plurality of inverters start at different timings, undesirable operation of the earth leakage circuit breaker can be more reliably prevented.

The following methods are preferably used to start the inverters at different timings.

(1) The time after at least one of the plurality of inverters satisfies the start condition until the inverter starts is controlled to be different from the time after another inverter satisfies the start condition until the inverter starts.

(2) The start condition of at least one of the plurality of inverters is controlled to be different from that of another inverter.

(3) At least one of the plurality of inverters has a means for allowing transmission of information to another inverter, and a start-enabling signal or start-inhibiting signal is transmitted between the inverters. More specifically, after the elapse of a predetermined time from the start of at least one of the plurality of inverters, a start-enabling signal is transmitted to another inverter. Alternatively, a start-inhibiting signal sent to another inverter is preferably canceled.

The start-timing of one of the plurality of inverters and that of another inverter are preferably separated by the operation time of the earth leakage circuit breaker or more. Under this control, the impulse-like leakage currents (to be referred to as "leakage impulses" hereinafter) generated when the individual inverters start are easily recognized as individual leakage impulses by the earth leakage circuit breaker. When the leakage impulse measurement result and controller design conditions (e.g., the manufacturing cost) by the present inventors are taken into consideration, the start-timings of the inverters are preferably separated by from 1 to 10 sec.

In preferred embodiments of the present invention, a solar battery module comprising a solar battery array has, on its lower surface, a metal lower-surface reinforcing plate. Especially, in the preferred embodiments, the lower-surface reinforcing plate is grounded. In this case, since the earth capacitance is large, the effect of the present invention becomes conspicuous.

In the preferred embodiments of the present invention, a solar battery array, in which a plurality of solar battery modules are series connected to form a string and in which a plurality of strings are parallelly connected, is preferably used. A solar power generation apparatus and control method for the apparatus according to preferred embodiments of the present invention will be described below in detail with reference to the accompanying drawings.

First Embodiment

FIG. 1 is a block diagram showing an experimental solar power generation system according to the first embodiment of the present invention. As shown in FIG. 1, this system has three solar battery arrays 11 to 13 each formed by a parallel circuit of series circuits each connecting a plurality of solar battery modules, three non-isolated, interconnected inverters 21 to 23 for converting direct-current power output from the solar battery arrays 11 to 13 to alternating-current power and supplying the power to a commercial power system 3, and an earth leakage circuit breaker 4 to which the outputs from the inverters 21 to 23 are parallelly connected. The inverters 21 to 23 do not simultaneously start. The arrangement of this system will be described below in detail. A capacitor 51 equivalently represents the earth capacitance of the solar battery array 11 and the capacitance of a capacitor constructing the output filter of the inverter 21. This also applies to capacitors 52 and 53.

Solar Battery Array

Figure 4:
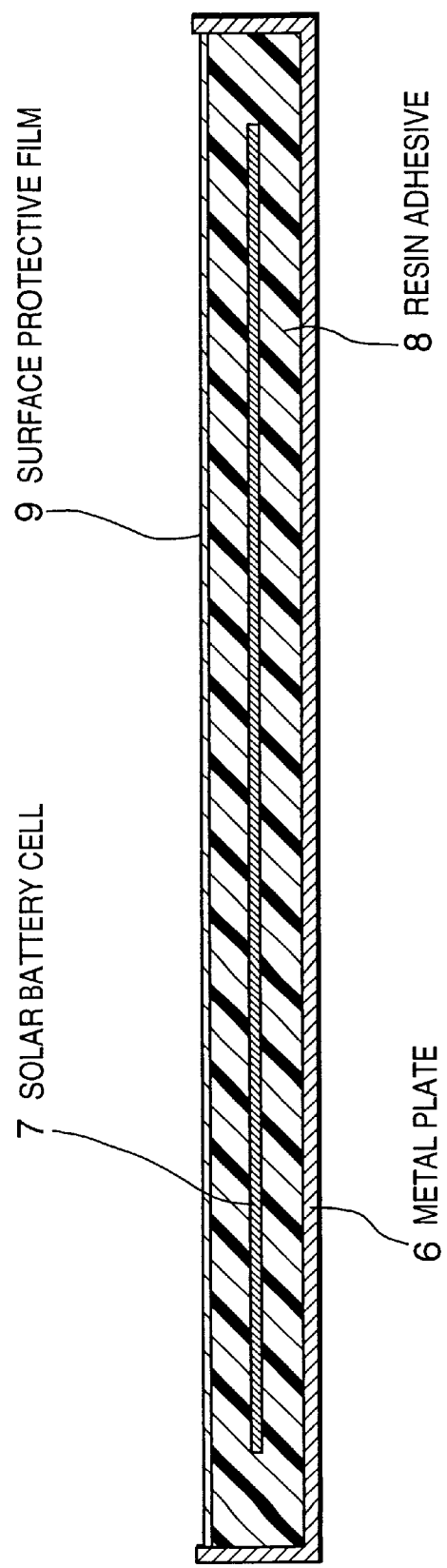
FIG. 4 is a view showing the structure of the solar battery module of the system shown in FIG. 1.
Figure 5:
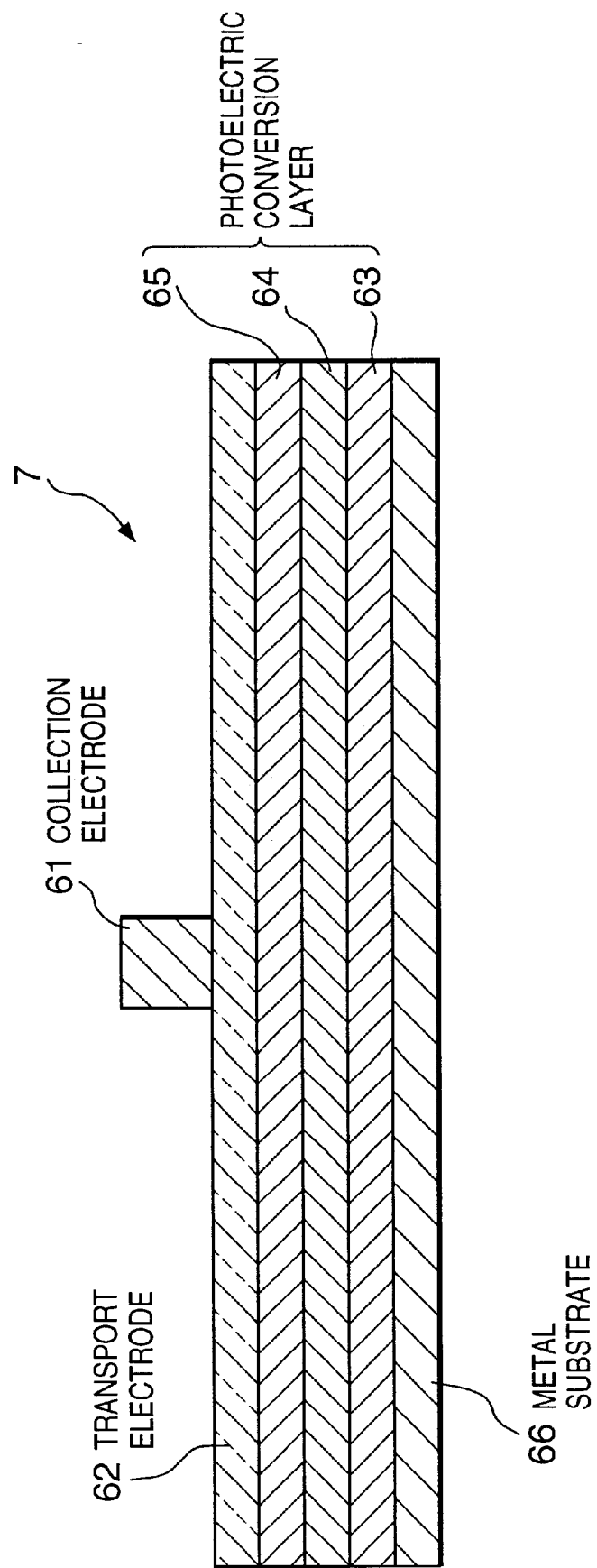
FIG. 5 is a view showing the structure of a solar battery cell of the solar battery module shown in FIG. 4.
Figure 6:
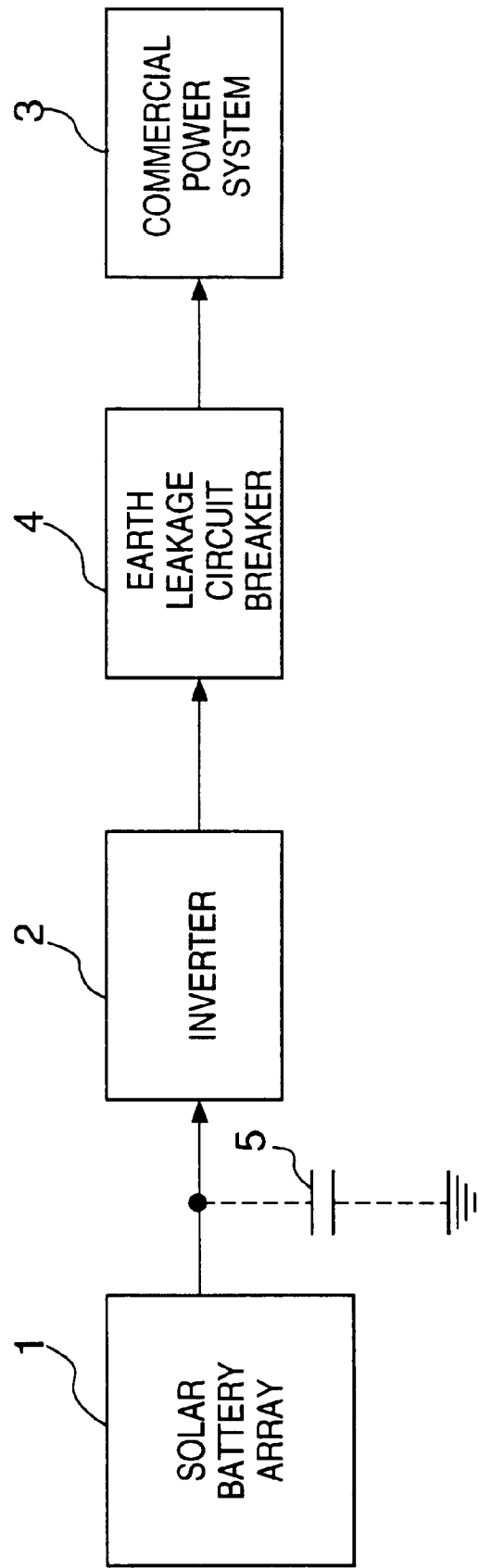
FIG. 6 is a block diagram showing a system interconnection solar power generation system having an earth capacitance.

The capacitance between the lower-surface reinforcing plate and the conductive portion of an amorphous solar battery module used in this embodiment, which has a width of 45 cm×length of 130 cm, and output power of 30 W, is 20 nF (measurement frequency: 120 Hz) per solar battery module. As shown in FIG. 4, the amorphous solar battery module has a structure in which an amorphous solar battery cell 7 with a three-layered structure of PIN-type photoelectric conversion layers formed from a semiconductor containing amorphous silicon is fixed on a metal plate 6 as a lower-surface reinforcing plate with adhesive 8 formed from an EVA (ethylene vinyl acetate) resin. A surface protective film 9 formed from an ETFE (polyethylene tatrafluoroethylene) film as a protective layer is fixed on the surface of the solar battery module with the adhesive 8. As shown in FIG. 5, the amorphous solar battery cell 7 has a structure having three photoelectric conversion layers 63 to 65 between a metal substrate 66 and a transparent electrode 62 having a collection electrode 61. The metal substrate 66 of the amorphous solar battery cell 7 is insulated from the metal plate 6 of the solar battery module.

Each solar battery array has 100 solar battery modules arrayed in a 10×10 matrix. More specifically, 10 solar battery modules are series connected to form a string, and 10 strings are parallelly connected. Each solar battery array is installed on ground using a metal frame (tilt angle: 30°) while being directed due south. The metal plates 6 of the solar battery arrays are grounded. The earth capacitance of each solar battery array is 2 $\mu$F. It is just 100 times the capacitance per module. Three solar battery arrays, i.e., the solar battery arrays 11 to 13 are prepared and connected to the inverters 21 to 23, respectively.

Inverter

Three transformerless inverters whose output capacity is 4.5 kW are prepared and named inverters 1, 2, and 3, respectively. The controller of each inverter has an input section for inputting a start-enabling signal and an output section for outputting an operation signal. The operation signal output from inverter 1 is connected to the start-enabling signal input of inverter 2. The operation signal output from inverter 2 is connected to the start-enabling signal input of inverter 3. With this arrangement, inverters 1, 2, and 3 are started in this order. A contact signal is input to the input section. Contact open represents OFF, and contact close represents ON. As the output section, for example, a relay contact which is normally OFF and represents a signal output in the ON state is used. A state wherein a signal is input to the input section is expressed as "input ON", and a state wherein a signal is output from the output section is expressed as "output ON".

Figure 7:
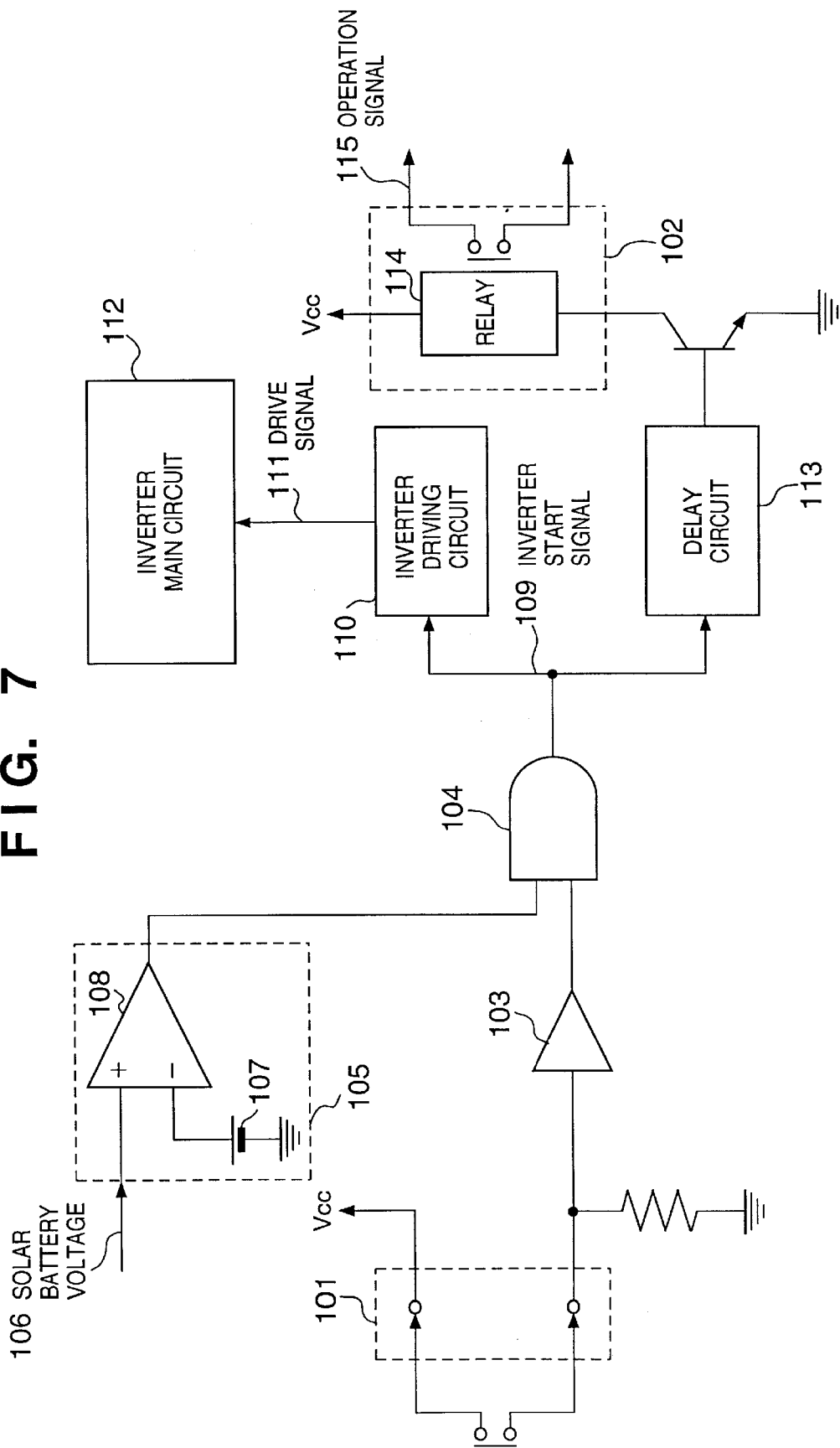
FIG. 7 is a block diagram showing the arrangement of a controller according to the first embodiment.

FIG. 7 is a block diagram showing the arrangement of a controller for controlling the operation of each inverter in the first embodiment.

Referring to FIG. 7, reference numeral 101 denotes a start-enabling signal input section and 102, an operation signal output section. The start-enabling signal input section 101 of inverter 1 is always ON, so inverter 1 can start anytime. As described above, the output sections 102 of inverters 1 and 2 are connected to the input sections 101 of inverters 2 and 3, respectively.

The start-enabling signal input section 101 is connected to one input of an AND gate 104 via a buffer amplifier 103. A start determination section 105 is connected to the other input of the AND gate 104.

The start determination section 105 compares a solar battery voltage 106 with a reference voltage 107. When the solar battery voltage 106 exceeds the reference voltage 107, the start determination section 105 outputs a start-enabling signal. For example, the start determination section 105 of the inverter 21 compares, by a comparator 108, the solar battery voltage 106 as an output voltage from the solar battery array 11 with the reference voltage 107. When the solar battery voltage 106 exceeds the reference voltage 107, the start determination section 105 outputs a start-enabling signal.

The AND gate 104 ANDs signals input from the input section 101 and start determination section 105 and outputs an inverter start signal 109. When start-enabling signals are input from both of the input section 101 and start determination section 105, the AND gate 104 outputs the inverter start signal 109. When the inverter start signal 109 is output, an inverter driving circuit 110 outputs a drive signal 111 to an inverter main circuit 112. The inverter main circuit 112 operates to start converting direct-current power to alternating-current power. The inverter main circuit 112 is not included in this controller.

The inverter start signal 109 is also input to a delay circuit 113, delayed by a predetermined time, and supplied to the base of a transistor for driving a relay 114 of the output section 102. When the relay 114 is driven by the transistor, the contact of the relay 114 is closed to output an operation signal 115. Hence, when the solar battery voltage 106 exceeds the reference voltage 107, an operation signal output from inverter 1 after the elapse of a predetermined time from the start of inverter 1 starts inverter 2. After the elapse of a predetermined time, an operation signal output from inverter 2 starts inverter 3.

As the delay circuit 113, an analog delay circuit or a digital delay circuit using a counter can be used. The operation signal is output five seconds after the start of the inverter.

As the interface for the start-enabling signal or operation signal, various interfaces can be used in addition to a contact type interface shown in FIG. 7. For example, an interface using a TTL logic signal, a general-purpose interface such as an RS232C, a current loop, or a photocoupler can be used. That is, a control circuit having another arrangement can be used in place of that shown in FIG. 7 without departing from the spirit and scope of the present invention.

The reference voltage 107 is set such that the inverter starts when the solar battery voltage 106 exceeds 100 V. In this embodiment, the inverter start conditions (e.g., the reference voltage 107) need not strictly coincide between the inverters. From the viewpoint of increasing generated energy, the condition for inverter 1 is preferably set less strict because inverters 2 and 3 cannot start unless inverter 1 operates. In this embodiment, the arrays connected to the inverters are installed with the same arrangement under the same condition. If the conditions are different, the above setting must be carefully done. For example, the start voltage (reference voltage 107) of inverter 1 is set to be lower than the start voltages of the remaining inverters, or a solar battery array capable of receiving sunlight most efficiently is connected to inverter 1.

Figure 8:
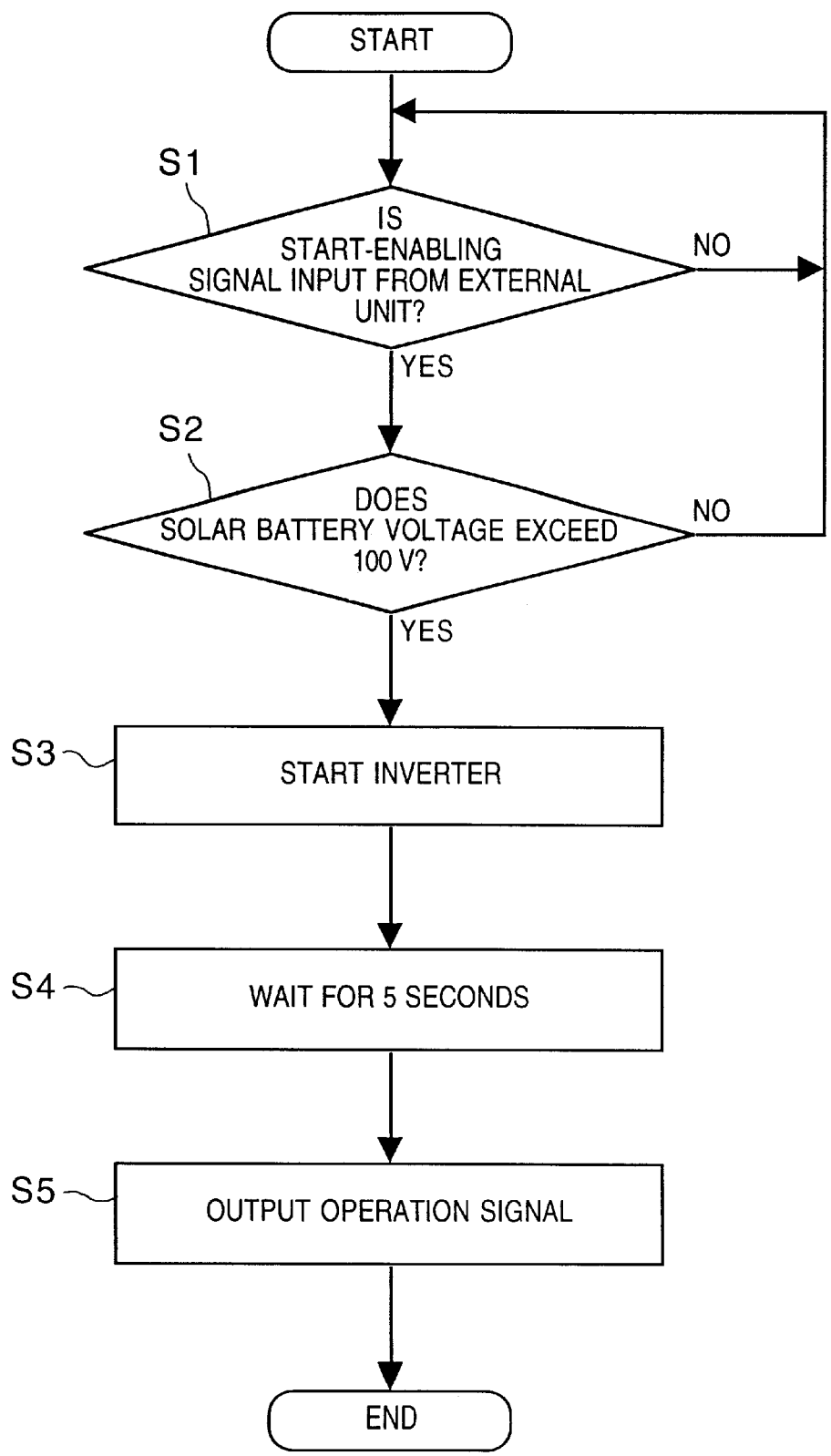
FIG. 8 is a flow chart showing control in the first embodiment.

FIG. 8 is a flow chart showing control by the controller shown in FIG. 7 at the start time of the inverter.

In steps S1 and S2, it is determined whether a start-enabling signal is input from an external unit and whether the solar battery voltage 106 exceeds 100 V. If the two conditions are satisfied, the inverter is started in step S3. After the elapse of a delay time of five seconds in step S4, an operation signal is output in step S5.

When an inverter connected to a solar battery array is connected to a commercial power system of 200 V and 60 Hz, the leakage current before the start of interconnection, which is measured by the inverter section, is about 0.3 mA. When three inverters are connected in parallel, the total leakage current is about 1 mA. When the number of inverters connected in parallel increases, the static leakage current increases, and the margin until breaking operation of the earth leakage circuit breaker 4 becomes small.

Earth Leakage Circuit Breaker

As the performance of the earth leakage circuit breaker 4 to be used, the rated current is 30 A, the rated sensitivity current representing earth leakage detection sensitivity is 30 mA, the rated non-operation current representing the dead zone is 15 mA, and the operation time is 0.1 second or less. This earth leakage circuit breaker is connected to the commercial power system 3 (200 V, 60 Hz) to build the experimental solar power generation system shown in FIG. 1. The sensitivity of the earth leakage circuit breaker 4 must have a sufficient margin against the above static leakage current.

Operation Experiments

Figure 3:
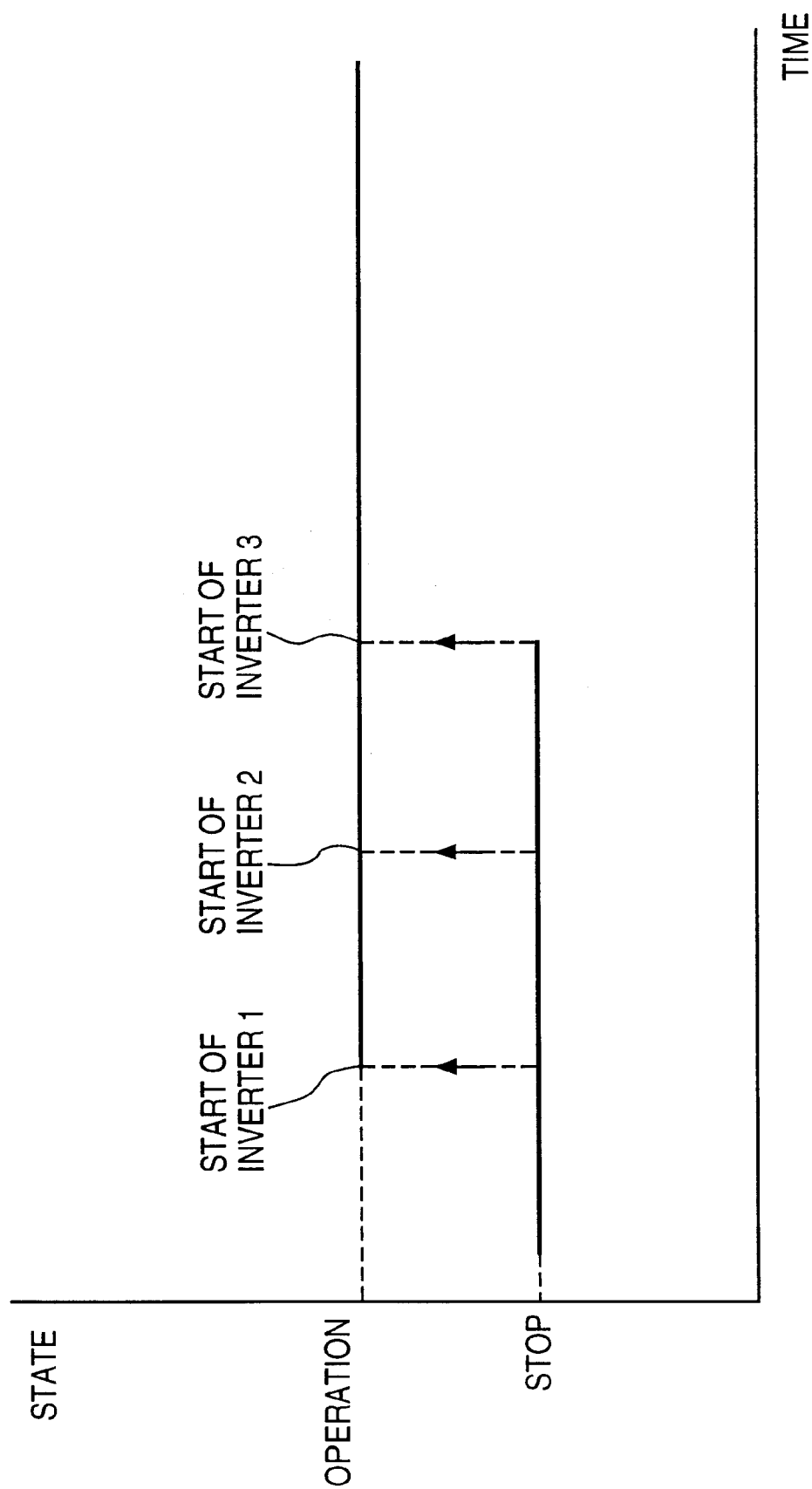
FIG. 3 is a graph showing the starting operation of the system shown in FIG. 1.

Start experiments were conducted on a fine day with sufficient sunlight intensity. In the solar power generation system of the first embodiment, inverter 2 started five seconds after the start of inverter 1. Another five seconds after that, inverter 3 started. The earth leakage circuit breaker 4 did not trip to the breaking state. FIG. 3 shows the start states of the inverters.

On the other hand, when start-enabling signals were input to the input sections 101 of the controllers of all the inverters to set inverters 2 and 3 in an "always start enabled state", like inverter 1, the inverters almost simultaneously started, and the earth leakage circuit breaker 4 tripped to the breaking state. Tripping to the breaking state did not occur every time; it occurred three times in 50 tests.

Figure 2:
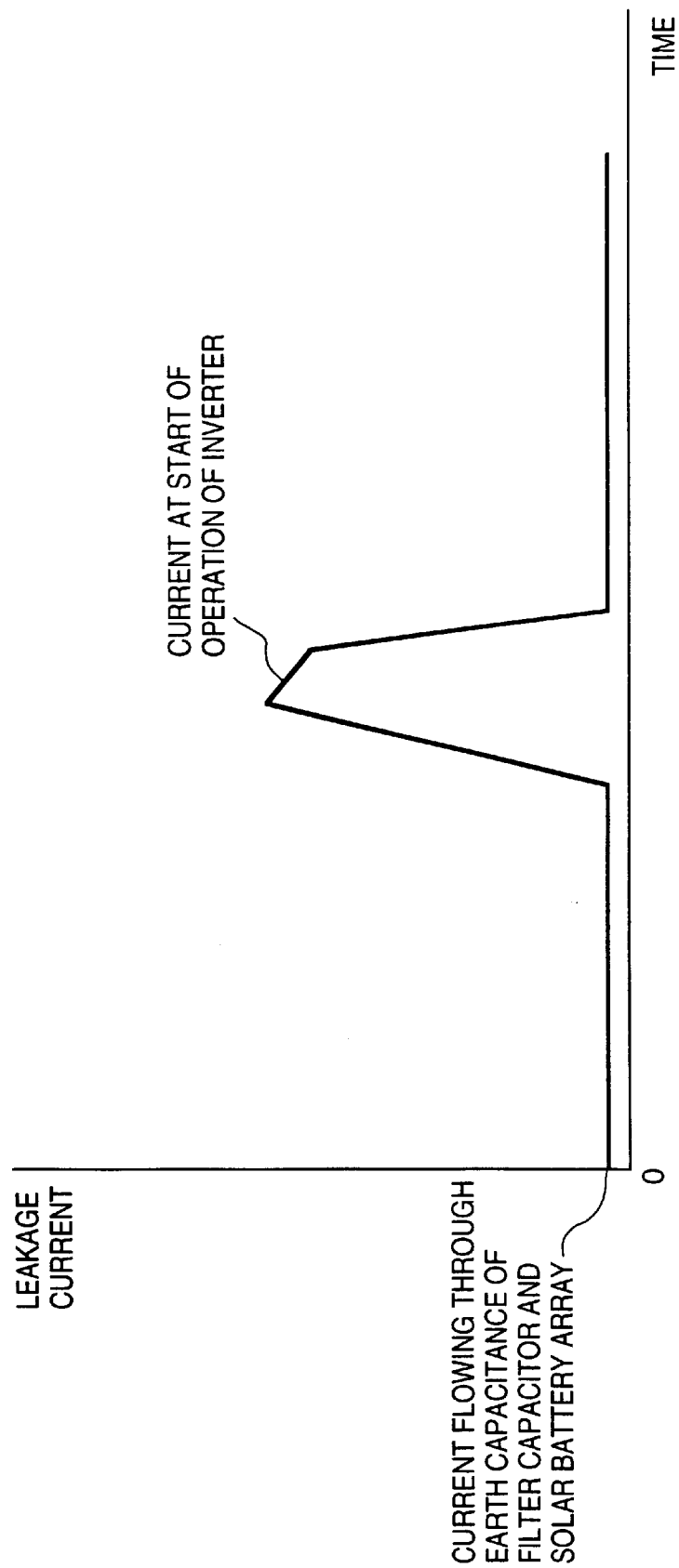
FIG. 2 is a graph showing an impulse-like leakage current at the start time.

This is supposedly because the magnitude of the leakage impulse current shown in FIG. 2 varies or the superposed state of the leakage impulse currents of the three inverters changes due to the fine shift of start-timing. In actual measurement, the leakage impulse current of this embodiment has a peak value of about 100 mA and a width of about 5 ms per inverter. When the inverters are simultaneously started, the leakage impulse currents are superposed on each other to trip to the breaking state. The earth leakage circuit breaker that has tripped to the breaking state does not automatically recover.

As described above, in the solar power generation system of this embodiment, i.e., the solar power generation system in which the plurality of inverters are prevented from simultaneously starting by shifting the start-timings of the inverters, unwanted tripping operation of the earth leakage circuit breaker 4 to the breaking state can be obviously prevented because the leakage impulse currents at the start time are not superposed on each other. Transmission of start-enabling signals (or start-inhibiting signals) to the inverters via cables or by radio is a versatile and reliable method of avoiding undesirable operation of the earth leakage circuit breaker 4, though it is somewhat cumbersome. This method is rarely influenced by solar battery array installation conditions.

Second Embodiment

The second embodiment of the present invention will be described next. In this embodiment, the start delay times of inverters, i.e., times until the inverters start after the start conditions are satisfied are set to have different values, thereby achieving the object of the present invention.

Arrangement

Solar battery arrays 11 to 13 and an earth leakage circuit breaker 4 are the same as those of the above-described first embodiment. Only inverters employ the following arrangement. Each inverter of the second embodiment has an input terminal for inputting a signal representing a sunlight intensity to detect the sunlight intensity on the solar battery array surface, and the sunlight intensity is used as a start condition.

As the sunlight intensity detector, a pyrheliometer (MS-801 (trade name) available from Eko Instruments Trading Co., Ltd) using a thermocouple is employed. Alternatively, various detectors such as a photodetector using a photodiode can be used. The pyrheliometer employed in the second embodiment outputs a voltage signal of 0 to 7 mV when the sunlight intensity is 0 to 1 $kW/m^2$. Since the output voltage of the pyrheliometer is low, a noise guard must be taken on the inverter side. The pyrheliometer employed in this embodiment is very expensive. Hence, in this embodiment, one pyrheliometer is used, and the output from the pyrheliometer is distributed to inverters 21 to 23. Sunlight intensity detectors may be prepared in units of inverters 21 to 23. In this case, the sunlight intensity detectors need have the same sensitivity.

As in the first embodiment, three inverters are prepared. The sunlight intensity at which the inverters 21 to 23 start is set to be 0.03 $kW/m^2$. The start delay time is set to be 1 second for inverter 1, 5 seconds for inverter 2, and 9 seconds for inverter 3.

Figure 9:
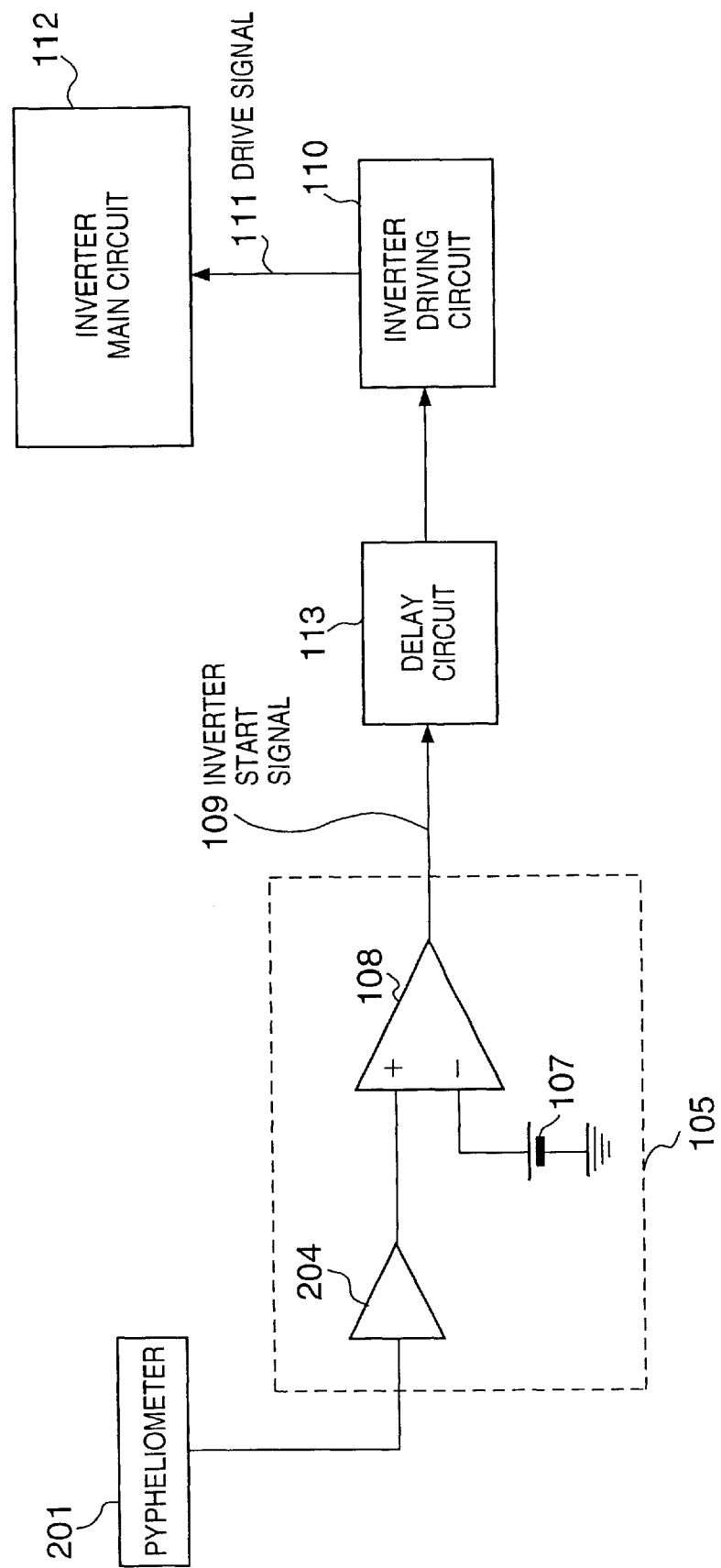
FIG. 9 is a block diagram showing the arrangement of a controller according to the second embodiment.

FIG. 9 is a block diagram showing the arrangement of a controller for controlling the operation of the inverter according to the second embodiment.

Referring to FIG. 9, a pyrheliometer 201 is connected to a start determination section 105. Although not illustrated, the output from the pyrheliometer 201 is parallelly connected to the start determination sections 105 of inverters 1 to 3. The output from the pyrheliometer 201 is input to a comparator 108 via a buffer amplifier 204 of the start determination section 105 and compared with a reference voltage 107. When the voltage input from the buffer amplifier 204 exceeds the reference voltage 107, the start determination section 105 outputs an inverter start signal. An inverter start signal 109 is delayed by a predetermined time by a delay circuit 113 and input to an inverter driving circuit 110. When the inverter start signal 109 is output, the inverter driving circuit 110 outputs a drive signal 111 to an inverter main circuit 112. The inverter main circuit 112 operates to start converting direct-current power to alternating-current power.

In the second embodiment, the start conditions (sunlight intensity values) are preferably as similar as possible. As the characteristic point of the second embodiment, a delay time is set after the start condition is satisfied until the inverter actually starts, and the delay time is set to be different to prevent the plurality of inverters from simultaneously starting. Hence, unless the start conditions themselves strictly coincide, the delay times do not simultaneously start, and desired delay times cannot be obtained. This is related to the values of delay times. Generally, when the delay time is relatively long, he coincidence accuracy of start conditions can be relaxed. From the viewpoint of coincidence between the start conditions, the arrangements and installation conditions of solar battery arrays preferably coincide with each other.

Operation Experiments

Start experiments as in the first embodiment showed that inverters 1 to 3 started in this order, and an earth leakage circuit breaker 4 did not operate.

In the second embodiment, the inverters need not transmit information, unlike the first embodiment. For this reason, a solar power generation system having a plurality of inverters can be relatively easily built. In the second embodiment, the sunlight intensity is used as the start condition. Any other factor may be used. When a solar battery voltage is used as in the first embodiment, the system becomes very simple because the output of the sunlight intensity detector need not be distributed.

Third Embodiment

As the third embodiment, an example in which the start conditions are set to be different will be described. In the third embodiment as well, the solar battery arrays and an earth leakage circuit breaker 4 are the same as those of the first and second embodiments, and only inverters are changed. More specifically, three inverters whose solar battery voltages at which the inverters start are different are prepared. The solar battery voltage is set to be 80 V for inverter 1, 100 V for inverter 2, and 120 V for inverter 3.

In this embodiment, the start operation in the morning of a fine day was confirmed. The three inverters started with a time delay of about 1 minute, and the object of the present invention could be achieved. In normal operation, the object of the present invention can be sufficiently achieved only by setting different start times with this simple method.

In the third embodiment, all of the inverters may be turned on simultaneously, though this does not occur frequently. This may take place when "manual start of inverters" or "start of inverters at the time of service interruption/recovery on the side of a commercial power system 3" occurs under a high-sunlight-intensity condition, i.e., when the solar battery voltage is 120 V or more. To start the inverters under such conditions, for example, another delay time need be set.

According to the above-described embodiments, the following effects can be obtained.

(1) Even in a large solar power generation system for generating large energy, the system can be built at low cost using a plurality of transformerless inverters having a small capacitance.

(2) Since superposition of transient leakage impulse currents at the start time of a plurality of inverters is decreased or eliminated, the sensitivity of the earth leakage circuit breaker 4 can be made higher than that in a solar power generation system which simultaneously starts a plurality of inverters. As a consequence, the safety of the solar power generation system can be increased.

(3) In the solar power generation system using solar battery modules each having a metal reinforcing plate on the lower surface, the workability of the solar battery modules is good, and a variety of installation forms are possible.

(4) When a solar power generation system is constructed by setting different start conditions or start delay times for a plurality of inverters, the plurality of inverters need not be connected via signal lines. Hence, undesirable breaking operation of the earth leakage circuit breaker 4 can be simply and easily prevented.

The present invention with these conspicuous effects is very useful in industrial applications.

As many apparently widely different embodiments of the present invention can be made without departing from the spirit and scope thereof, it is to be understood that the invention is not limited to the specific embodiments thereof except as defined in the appended claims.

What is claimed is:

1. A solar power generation apparatus comprising:

solar battery arrays, each of which has solar battery modules;

non-isolated inverters, each of which converts direct-current power generated by one of said solar battery arrays to alternating-current power and provides the alternating-current power to a commercial power system;

an earth leakage circuit breaker arranged between said non-isolated inverters and the commercial power system and connected to outputs of said non-isolated inverters in parallel; and a controller which controls operation of said non-isolated inverters, wherein said controller controls start-timing of the operation of at least one inverter to be different from that of another inverter.

2. The apparatus according to claim 1, wherein start-timings of operation of all the non-isolated inverters are different.

3. The apparatus according to claim 1, wherein each solar battery array is formed by series connecting solar battery modules to form a string and parallely connecting a plurality of strings.

4. The apparatus according to claim 1, wherein each of the solar battery modules has a conductive lower-surface reinforcing member.

5. The apparatus according to claim 4, wherein said conductive lower-surface reinforcing member is formed from a metal.

6. The apparatus according to claim 4, wherein the conductive lower-surface reinforcing member is grounded.

7. The apparatus according to claim 1, wherein a time after a start condition is satisfied until the at least one inverter starts is set to be different from that after the start condition is satisfied until the another inverter starts so that the start-timings of the non-isolated inverters are different.

8. The apparatus according to claim 1, wherein a start condition of the at least one inverter is set to be different from that of the another inverter so that the start-timings of the non-isolated inverters are different.

9. The apparatus according to claim 1, further comprising transmission means for transferring a start-enabling signal or start-inhibiting signal to the at least one inverter from the another inverter, wherein the start-timing of said operation is controlled by the signal.

10. The apparatus according to claim 9, wherein the signal is transferred after the operation of the another inverter has been started.

11. The apparatus according to claim 1, wherein an operation-start-timing of the at least one inverter is different from that of the another inverter by not less than an operation time of said earth leakage circuit breaker.

12. The apparatus according to claim 1, wherein the controller controls a period between the start-timing of the operation of the at least one inverter and that of the another inverter to 1 to 10 seconds.

13. A control method for a solar power generation apparatus having solar battery arrays each of which has solar battery modules, non-isolated inverters, each of which converts direct-current power generated by one of the solar battery arrays to alternating-current power and provides the alternating-current power to a commercial power system, and an earth leakage circuit breaker arranged between said non-isolated inverters and the commercial power system and connected to outputs of the non-isolated inverters in parallel, said method comprising the step of controlling start-timing of operation of at least one inverter to be different from that of another inverter.

14. The method according to claim 13, further comprising the step of controlling all start-timings of operation of the non-isolated inverters to be different from each other.

15. The method according to claim 13, further comprising the step of setting a time after a start condition is satisfied until the at least one inverter starts to be different from that after the start condition is satisfied until the another inverter starts so that the start-timings of the non-isolated inverters are different.

16. The method according to claim 13, further comprising the step of setting a start condition of the at least one inverter to be different from that of the another inverter so that the start-timings of the non-isolated inverters are different.

17. The method according to claim 13, further comprising the step of transferring a start-enabling signal or start-inhibiting signal to the at least one inverter from the another inverter, wherein the start-timing of said operation is controlled by the signal.

18. The method according to claim 17, wherein the signal is transferred after the operation of the another inverter has been started.

19. The method according to claim 13, wherein the control step controls an operation-start-timing of the at least one inverter to be different from that of the another inverter by not less than an operation time of said earth leakage circuit breaker.

20. The method according to claim 13, wherein in the controlling step, a period between the start-timing of the operation of the at least one inverter and that of the another inverter is controlled to 1 to 10 seconds.

* * * * *

UNITED STATES PATENT AND TRADEMARK OFFICE
CERTIFICATE OF CORRECTION

PATENT NO.    : 6,259,017 B1
DATED         : July 10, 2001
INVENTOR(S)   : Nobuyoshi Takehara et al.

Page 1 of 1

It is certified that error appears in the above-identified patent and that said Letters Patent is hereby corrected as shown below:

<u>Column 1,</u>
Line 29, "outdoor" should read -- outdoors --.

<u>Column 2,</u>
Line 7, "resent" should read -- present --.

<u>Column 4,</u>
Line 37, "tatrafluoroethylene)" should read -- tetrafluoroethylene) --.

Signed and Sealed this

Second Day of April, 2002

Attest:

Attesting Officer

JAMES E. ROGAN
*Director of the United States Patent and Trademark Office*